United States Patent
Patel et al.

(10) Patent No.: US 9,653,984 B2
(45) Date of Patent: May 16, 2017

(54) FILTER CAPACITOR DEGRADATION DETECTION APPARATUS AND METHOD

(75) Inventors: Yogesh Popatlal Patel, Grafton, WI (US); Lixiang Wei, Whitefish Bay, WI (US); Russel J. Kerkman, Milwaukee, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 1113 days.

(21) Appl. No.: 13/570,781

(22) Filed: Aug. 9, 2012

(65) Prior Publication Data
US 2013/0286692 A1    Oct. 31, 2013

Related U.S. Application Data

(60) Provisional application No. 61/640,398, filed on Apr. 30, 2012.

(51) Int. Cl.

| | |
|---|---|
| H02M 1/32 | (2007.01) |
| H02M 1/12 | (2006.01) |
| H02M 5/458 | (2006.01) |
| H01G 4/40 | (2006.01) |
| G01R 31/42 | (2006.01) |
| G01R 31/02 | (2006.01) |

(52) U.S. Cl.
CPC ........... *H02M 1/32* (2013.01); *H02M 1/126* (2013.01); *G01R 31/028* (2013.01); *G01R 31/42* (2013.01); *H01G 4/40* (2013.01); *H02M 5/4585* (2013.01)

(58) Field of Classification Search
CPC .. H02M 1/126; H02M 5/4585; G01R 31/016; G01R 31/028
USPC .................................................. 702/60
See application file for complete search history.

(56) References Cited

U.S. PATENT DOCUMENTS

| | | |
|---|---|---|
| 4,419,621 A | 12/1983 | Becker |
| 4,721,916 A | 1/1988 | Hanasawa |
| 5,319,513 A | 6/1994 | Lowenstein et al. |
| 5,796,258 A | 8/1998 | Yang |
| 5,804,973 A | 9/1998 | Shinohara |
| 6,166,929 A | 12/2000 | Ma et al. |
| 6,208,537 B1 | 3/2001 | Skibinski et al. |
| 6,269,010 B1 | 7/2001 | Ma et al. |
| 6,366,483 B1 | 4/2002 | Ma et al. |
| 6,525,951 B1 | 2/2003 | Paice |

(Continued)

FOREIGN PATENT DOCUMENTS

| | | |
|---|---|---|
| CN | 201393056 Y | 1/2010 |
| EP | 1990900 A1 | 11/2008 |

(Continued)

OTHER PUBLICATIONS

Bhattacharya, Basic Electrical and Electronics Engineering, Aug. 18, 2011.*

(Continued)

*Primary Examiner* — Michael Nghiem
*Assistant Examiner* — Peter Ngo
(74) *Attorney, Agent, or Firm* — Fay Sharpe LLP

(57) ABSTRACT

Power conversion systems and methods are presented for detecting input filter capacitor degradation or approach of end of operational life based on filter capacitor current measurements using single and/or dual threshold comparisons for computed instantaneous sum of squares of filter currents or power values.

15 Claims, 9 Drawing Sheets

(56) References Cited

U.S. PATENT DOCUMENTS

| | | | |
|---|---|---|---|
| 6,642,689 B2 | 11/2003 | Ishida et al. | |
| 6,667,866 B1* | 12/2003 | LaPlace | H02H 3/063 361/42 |
| 7,274,576 B1 | 9/2007 | Zargari et al. | |
| 7,495,410 B2 | 2/2009 | Zargari et al. | |
| 7,495,938 B2 | 2/2009 | Wu et al. | |
| 7,511,976 B2 | 3/2009 | Zargari et al. | |
| 7,602,127 B2 | 10/2009 | Coumou | |
| 7,616,005 B2 | 11/2009 | Kalyuzhny et al. | |
| 7,683,568 B2 | 3/2010 | Pande et al. | |
| 7,764,523 B2 | 7/2010 | Conticelli et al. | |
| 7,782,009 B2 | 8/2010 | Wiseman | |
| 7,786,735 B2 | 8/2010 | Kalyuzhny et al. | |
| 7,812,615 B2 | 10/2010 | Gajic et al. | |
| 7,818,137 B2 | 10/2010 | Agarwal | |
| 8,009,450 B2 | 8/2011 | Royak et al. | |
| 8,044,631 B2 | 10/2011 | Dai et al. | |
| 8,183,874 B2 | 5/2012 | Dommaschk | |
| 8,259,426 B2 | 9/2012 | Xiao et al. | |
| 8,259,480 B2 | 9/2012 | Hasler | |
| 8,350,397 B2 | 1/2013 | Lang et al. | |
| 8,395,910 B2 | 3/2013 | Alexander | |
| 8,400,800 B2 | 3/2013 | Alexander | |
| 8,587,160 B2 | 11/2013 | Dai et al. | |
| 8,643,383 B2 | 2/2014 | Xiao | |
| 8,648,610 B2 | 2/2014 | Mikami | |
| 8,698,507 B2 | 4/2014 | Huang | |
| 8,729,844 B2 | 5/2014 | Feng et al. | |
| 8,937,796 B2 | 1/2015 | Xiao et al. | |
| 9,054,589 B2 | 6/2015 | Cheng et al. | |
| 2001/0017489 A1 | 8/2001 | Inoue et al. | |
| 2001/0048604 A1 | 12/2001 | Oka et al. | |
| 2004/0257093 A1 | 12/2004 | Sakiyama | |
| 2007/0211501 A1 | 9/2007 | Zargari et al. | |
| 2007/0247104 A1* | 10/2007 | Garza | H02P 27/16 318/807 |
| 2007/0297202 A1 | 12/2007 | Zargari et al. | |
| 2008/0180055 A1 | 7/2008 | Zargari et al. | |
| 2009/0072982 A1 | 3/2009 | Cheng et al. | |
| 2009/0128083 A1 | 5/2009 | Zargari | |
| 2010/0025995 A1 | 2/2010 | Lang et al. | |
| 2010/0080028 A1 | 4/2010 | Cheng et al. | |
| 2010/0161259 A1 | 6/2010 | Kim et al. | |
| 2011/0292696 A1* | 12/2011 | Xiao | H02M 1/32 363/37 |
| 2012/0271572 A1 | 10/2012 | Xiao | |
| 2013/0057297 A1 | 3/2013 | Cheng | |
| 2013/0076151 A1 | 3/2013 | Bae et al. | |
| 2013/0279214 A1 | 10/2013 | Takase et al. | |
| 2013/0289911 A1 | 10/2013 | Patel et al. | |
| 2014/0012552 A1 | 1/2014 | Zik | |
| 2014/0217980 A1 | 8/2014 | Malrieu | |
| 2014/0320056 A1 | 10/2014 | Royak | |
| 2015/0092460 A1 | 4/2015 | Tallam | |
| 2015/0153397 A1 | 6/2015 | Kerkman et al. | |
| 2015/0155794 A1 | 6/2015 | Long | |
| 2015/0241503 A1 | 8/2015 | Bhandarkar | |
| 2015/0263600 A1 | 9/2015 | Bhandarkar et al. | |

FOREIGN PATENT DOCUMENTS

| | | | |
|---|---|---|---|
| EP | 2299568 A1 | | 3/2011 |
| EP | 2 390 997 A2 | | 11/2011 |
| EP | 2660962 A2 | | 11/2013 |
| FR | 2980053 | | 3/2011 |
| WO | WO2012110087 | * | 2/2011 |
| WO | WO 2011/124223 A2 | | 10/2011 |
| WO | WO 2013/038098 | | 3/2013 |

OTHER PUBLICATIONS

Rodriguez-Valdez, et al., "Phase Locked Loop for Unbalanced Utility Conditions", 2010 Applied Power Electronics Conference and Exposition (APEC), 2010 $25^{th}$ Annual IEEE 2010, Piscataway, NJ, Feb. 21, 2010, pp. 634-641.

Chinese Office Action, CN Appl. No. 201310156239.3; Mailed Feb. 2, 2015, Completed Jan. 23, 2015; Examiner Shen Min; 12 pgs.

ABB Bay Control REC670 Application manual, Relion 670 series, http://www05./abb.com/global/scot/scot354.nsf, Oct. 10, 2011, pp. 1-586.

Transformer protection RET670 ANSI Application manual, Relion 670 series, http://www.abb.com/product/db0003db004281/c12573e700330419c/257f000263ad5.aspx#!, May 6, 2011, pp. 1-864.

"Protective Relays", iCP-630 Capacitor Bank Protection Relay, Cooper Power Systems, Jan. 2011, pp. 1-8.

ABB Distribution Automation Handbook, Section 8.10 Protection of Capacitor Banks, Mar. 5, 2011.

GE C70 Capacitor Bank Protection and Control System UR Series Instruction Manual C70 Revision: 6.0x, Copyright @ 2011, GE Multilin, http://www.GEmultilin.com, pp. 1-644.

"iCP-630 Capacitor Bank Protection Relay", Cooper Power Systems, Mar. 2007, Jan. 23, 2015.

U.S. Appl. No. 13/872,177, filed Apr. 29, 2013.
U.S. Appl. No. 14/042,753, filed Oct. 1, 2013.
U.S. Appl. No. 14/095,169, filed Dec. 3, 2013.
U.S. Appl. No. 14/187,972, filed Feb. 24, 2014.
U.S. Appl. No. 14/204,317, filed Mar. 11, 2014.
U.S. Appl. No. 14/296,836, filed Jun. 5, 2014.

European Search Report completed Jul. 20, 2015 for Application No. EP 15 15 6270.

Lee, et al., "Online capacitance estimation of DC-link electrolytic capacitors for three-phase AC/DC/AC PWM converters using recursive least squares method", IEE Proc.-Electr. Power Appl., vol. 152, No. 6, Nov. 2005.

A Modified Direct Power Control Strategy allowing the Connection of Three-Phase Inverters to the Grid Through LCL Filters. Serpa, et al. IEEE Transactions on Industry Applications, vol. 43, No. 5, Sep./Oct. 2007.

Exploring Inherent Damping Characteristic of LCL-Filters for Three-Phase Grid-Connected Voltage Source Inverters. Tang, et al. IEEE, 2010.

Investigation of Active Damping Approaches for PI-based Current Control of Grid-Connected PWM Converters with LCL Filters. Dannehl et al. IEEE 2009.

Design and Control for Three-phase Grid-Connected Photovoltaic Inverter with LCL Filter. Chen et al. IEEE 2009.

U.S. App. No. 13/570,919 mailed Sep. 13, 2016.

* cited by examiner

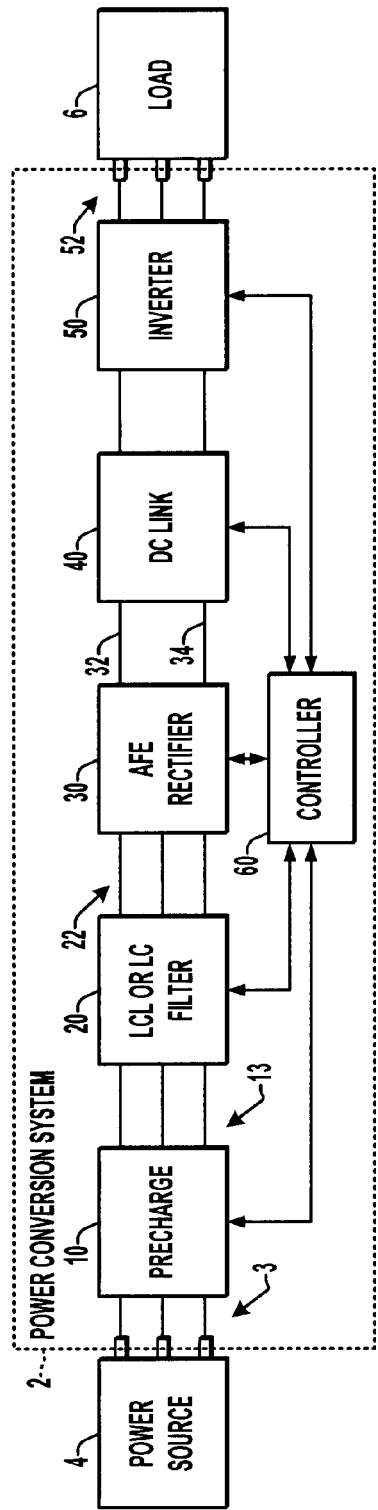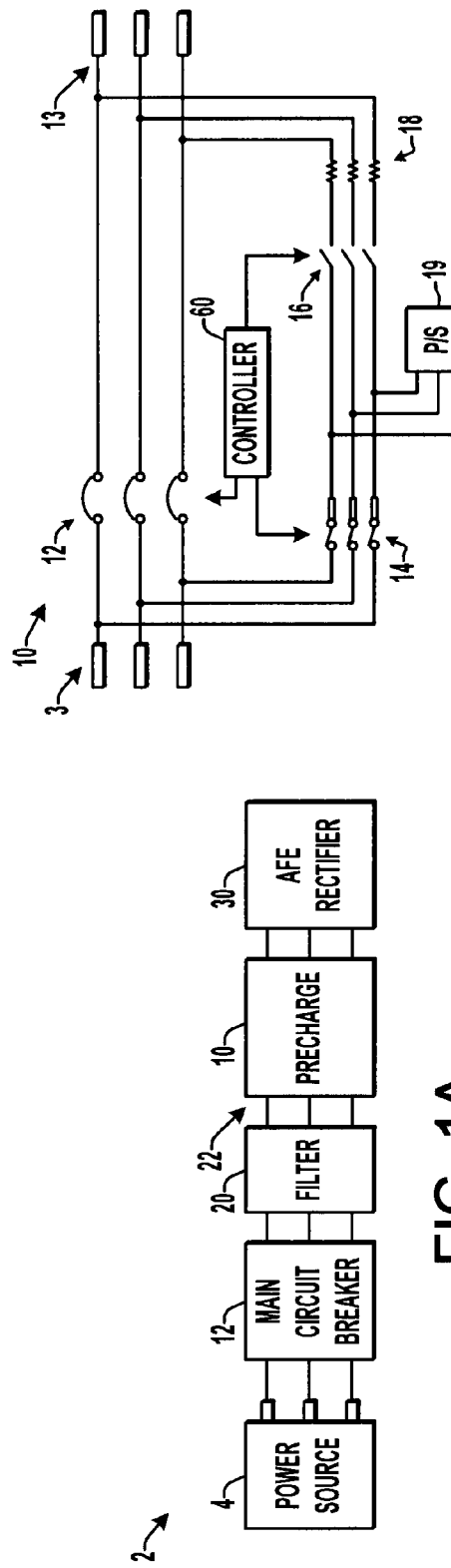

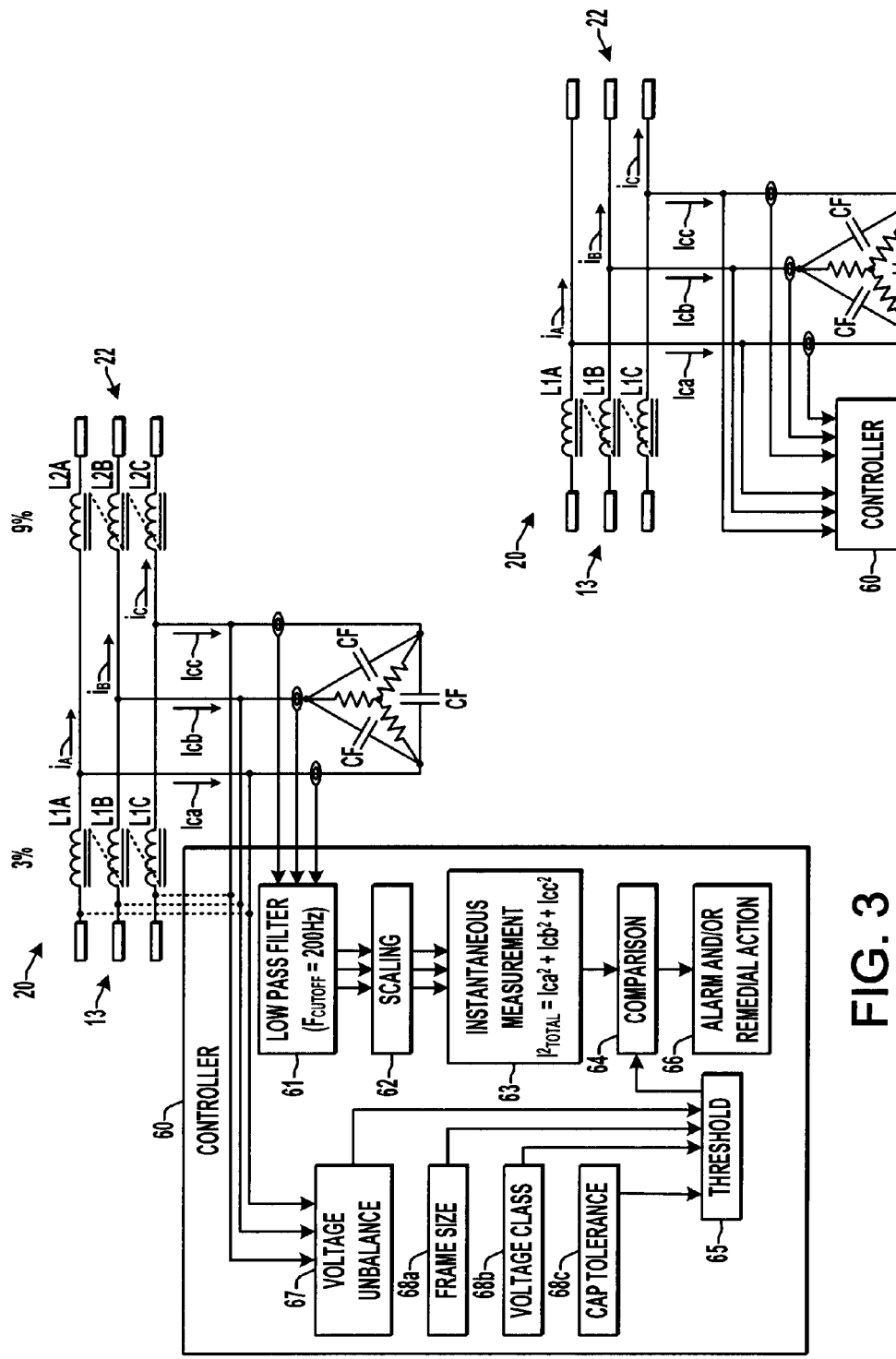

FILTER CAPACITOR DEGRADATION DETECTION APPARATUS AND METHOD

REFERENCE TO RELATED APPLICATION

This application claims priority to and the benefit of U.S. Provisional Patent Application Ser. No. 61/640,398, filed Apr. 30, 2012, entitled LCL FILTER CAPACITOR FAILURE DETECTION VIA CURRENT MEASUREMENT, the entirety of which is hereby incorporated by reference.

BACKGROUND

Motor drives and other power conversion systems operate using power from AC power sources, and typically include an input filter to reduce switching noise associated with operation of the power converter, particularly to control total harmonic distortion (THD) generated by high frequency operation of certain active front end (AFE) rectifiers. In particular, many power conversion systems utilize inductor-capacitor (LC) or inductance-capacitance-inductance (LCL) input filter circuitry associated with each AC input phase to control the harmonic content of a power grid. Such LC or LCL filter circuits are subject to damage or degradation of the filter capacitors. Failure of filter capacitors may be costly in terms of replacement component costs, labor for inspection and replacement, as well as downtime for the power conversion system and any associated machinery. Thusfar, however, assessing the performance and any degradation in the input filter capacitors has been difficult, and initial capacitor degradation may not be identifiable by visual inspection by service personnel.

SUMMARY

Various aspects of the present disclosure are now summarized to facilitate a basic understanding of the disclosure, wherein this summary is not an extensive overview of the disclosure, and is intended neither to identify certain elements of the disclosure, nor to delineate the scope thereof. Rather, the primary purpose of this summary is to present various concepts of the disclosure in a simplified form prior to the more detailed description that is presented hereinafter. The present disclosure provides power converters and techniques for identifying suspected filter capacitor degradation based in whole or in part on measured filter capacitor currents.

Power conversion systems are provided, which include a filter circuit coupled between an AC input and a rectifier. The filter circuit includes a plurality of filter capacitors which may be connected in a delta configuration or in a Y configuration in various embodiments. A controller identifies suspected filter capacitor degradation at least partially according to currents flowing in the filter capacitors. In certain embodiments, a sum of squares value of the filter capacitor currents is compared with a threshold for identification of suspected filter capacitor degradation. The filter capacitor current values may be filtered in certain embodiments using a low pass filter with a cutoff frequency set between the second and third harmonics of a power source fundamental frequency, and the threshold value may be selectively adjusted according to various parameters including measured voltage balance conditions in the power converter. In some embodiments, an instantaneous active power and/or reactive power value is computed and compared with a threshold for selectively identifying suspected filter capacitor degradation. In certain embodiments, moreover, the individual filter capacitors are formed by interconnection of two or more component capacitors, and the threshold is at least partially based on the capacitance of the component capacitors and on the series and/or parallel interconnection configuration of the component capacitors. In certain embodiments, the controller selectively identifies suspected filter capacitor degradation if a computed sum of the squares value, instantaneous active power value, or an instantaneous reactive power value is greater than an upper threshold or less than a lower threshold. In certain implementations, moreover, the controller measures one or more power converter voltages and selectively adjusts the upper and/or lower threshold based on the voltage. For example, the controller in certain embodiments increases the threshold(s) if the voltage is greater than a nominal value and decreases the threshold(s) if the voltage is below the nominal value.

Methods and non-transitory computer readable mediums are provided with computer executable instructions for identifying suspected filter capacitor degradation in a power conversion system. The method and computer executable instructions provide for measuring currents associated with a plurality of filter capacitors of the power conversion system, and selectively identifying suspected filter capacitor degradation at least partially according to the filter capacitor currents. In certain embodiments, the method includes computing a sum of the squares of a plurality of filter capacitor currents, and selectively identifying suspected filter capacitor degradation if the computed sum exceeds a threshold. Certain embodiments, moreover, may include filtering the measured filter capacitor currents using a low pass filter, as well as adjusting the threshold at least partially according to a determined AC voltage balance condition. In certain embodiments, the method includes computing an instantaneous active and/or reactive power value and selectively identifying suspected filter capacitor degradation if the computed power value exceeds a threshold. In certain embodiments, moreover, suspected filter capacitor degradation is selectively identified if a computed sum of the squares value, instantaneous active power value, or an instantaneous reactive power value is greater than an upper threshold or less than a lower threshold. Certain embodiments of the method may further include measuring at least one power converter voltage and selectively adjusting one or both thresholds based on the voltage, such as by increasing the threshold(s) if the voltage is greater than a nominal value and decreasing the threshold(s) if the voltage is below the nominal value.

BRIEF DESCRIPTION OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings, in which:

FIG. 1 is a schematic diagram illustrating a power conversion system with a controller configured to identify suspected filter capacitor degradation according to filter capacitor currents;

FIG. 1A is a schematic diagram illustrating an alternate power converter embodiment with a main circuit breaker between the AC input and the input filter circuit, with a precharge circuit connected between the filter output and the input of the rectifier;

FIG. 2 is a schematic diagram illustrating a precharge circuit in the power converter of FIG. 1;

FIG. 3 is a schematic diagram illustrating a delta-connected LCL filter circuit with a controller performing a threshold comparison of an instantaneous sum of squares filter capacitor current value for selective identification of suspected filter capacitor degradation;

FIG. 3A is a schematic diagram illustrating an LC filter circuit arrangement for a current source converter embodiment including delta-connected filter capacitors;

DETAILED DESCRIPTION

Figure 4A:
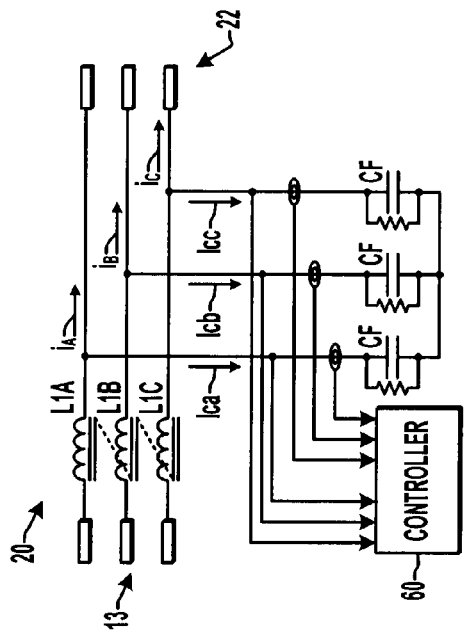
FIG. 4A is a schematic diagram illustrating an LC filter circuit arrangement for a current source converter embodiment including Y-connected filter capacitors.

Referring now to the figures, several embodiments or implementations are hereinafter described in conjunction with the drawings, wherein like reference numerals are used to refer to like elements throughout, and wherein the various features are not necessarily drawn to scale.

Figure 5:
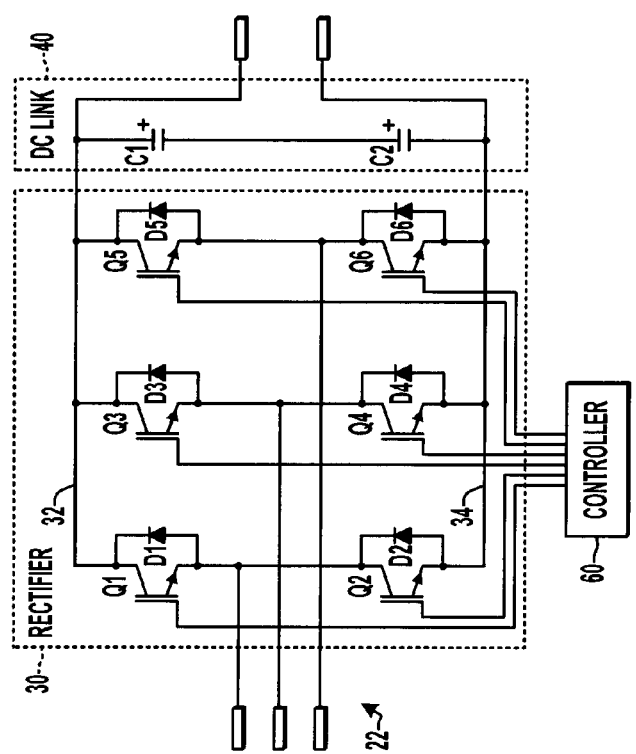
FIG. 5 is a schematic diagram illustrating an active front end (AFE) rectifier and a DC link in the power conversion system of FIG. 1.

FIG. 1 illustrates a power conversion system 2 including a precharge circuit 10, an LCL or LC input filter circuit 20, an active front end (AFE) rectifier 30, a DC link circuit 40, an inverter 50, and a controller 60. The power conversion system 2 receives multiphase AC input power from a power source 4 and provides AC output power to a single or multiphase load 6, such as a motor. The power converter 2 includes an AC input 3 coupleable to receive AC input power from the power source 4, and the inverter 50 provides an AC output 52 to drive the load 6. In certain embodiments, the power conversion system is a current source converter (CSC) system having an LC filter circuit 20 and a DC link 40 with one or more inductances (e.g., such as a DC link choke) to accommodate DC link current provided by the rectifier 30 and used as input power by the inverter 50. In other embodiments described herein, the converter 2 is a voltage source converter (VSC) type with an LCL filter circuit 20, in which the DC link circuit 40 includes one or more DC link capacitances (e.g., C1 and C2 as seen in FIG. 5 below). The power source 4 provides multiphase AC input power, where the illustrated examples show a three-phase implementation, although other multiphase implementations are possible having three or more input phases. Moreover, the inverter 50 can provide a single phase or multiphase output 52, with the illustrated examples showing a three-phase inverter 50 driving a three-phase load 6 (e.g., a motor). The converter 2, moreover, can be a motor drive although any form of power conversion system 2 may be implemented according to the present disclosure, whether driving a motor or a different form of single or multiphase load 6.

The controller 60 can be implemented as any hardware, processor-executed software, processor-executed firmware, programmable logic and/or combinations thereof to implement the filter capacitor degradation detection functionality set forth herein including other functions associated with operation of the power conversion system 2. In certain embodiments, the controller 60 may be implemented as a single processor-based circuit and/or may be implemented using multiple processor elements. For instance, certain filter capacitor degradation detection functions set forth herein may be implemented in a local controller 60, such as a field programmable gate array (FPGA) implemented in the LCL input filter circuit 20, and/or such features may be implemented using a centralized controller 60 in certain embodiments. In yet other possible implementations, hardware circuits may be used to implement one or more of the capacitor degradation detection features, alone or in combination with one or more processor components.

As seen in FIG. 2, the precharge circuit 10 includes a main circuit breaker 12, a fused disconnect apparatus 14, a precharge contactor 16 and precharge resistors 18, and is operable in one of three modes. The precharge circuit 10 may be omitted in certain embodiments. As seen in FIG. 1A, alternate power converter embodiments can provide the main circuit breaker 12 between the AC input 3 and the input filter circuit 20, with a precharge circuit 10 with precharge contactor 16 and precharge resistors 18 connected between the filter output 22 and the input of the rectifier 30. In the illustrated example of FIG. 2, the precharge circuitry 10 is operated by the controller 60, which may be integrated with an overall power conversion system controller 60 and/or which may be a separate processor-based controller. In certain embodiments, the contacts of the fused disconnect 14 are typically closed and will be opened only upon occurrence of an excess current condition. In a normal operating mode, the controller 60 (e.g., a central controller or a local precharge I/O board or precharge controller) maintains the main circuit breaker 12 in the closed position to allow input power to flow from the power source 4 to precharge output terminals 13, but maintains the precharge contactor 16 in an "open" (e.g., nonconductive) condition, whereby no current flows through the pre-charge resistors 18. In a "precharge" mode (e.g., at startup or controlled reset of the power conversion system 2), the controller 60 switches the main circuit breaker 12 into the "open" condition and closes the precharge contactor 16, to allow current to flow from the AC source 4 through the precharge resistors 18 to the precharge output terminals 13. This effectively inserts the precharge resistors 18 into the multiphase power circuitry during the "precharge" mode to control excessive current spikes to charge the capacitance of a DC bus in the DC link circuit 40 at the output of the rectifier 30 and/or at the input of the inverter 50 (e.g., capacitors C1 and C2 in the example of FIG. 5 below). In operation, the controller 60 may be provided with one or more feedback signals by which a DC link voltage can be monitored, and once the DC voltage exceeds a predetermined value, the controller 60 closes the main breaker 12 and opens the precharge contactor 16 to enter the normal mode of operation. The precharge circuitry 10 can also be operated in a "standby" mode, in which the controller 60 maintains both the main circuit breaker 12 and the precharge contactor 16 in the "open" condition, with auxiliary power being provided to various control circuits by a power supply 19 (FIG. 2). In certain embodiments, moreover, the precharge circuit 10 is operable by the controller 60 to selectively open both the main circuit breaker 12 and the precharge contactor 16 in response to indication of suspected filter capacitor degradation as described further below.

As seen in FIG. 1A, in other possible embodiments, the precharge circuit 10 may be located between filter circuit 20 and the rectifier 30. In certain implementations, a main circuit breaker 12 may be connected between the AC input 3 and the filter circuit 20 to facilitate turning the power off, and the precharge circuit 10 will include a precharge contactor 16 and precharge resistors 18 connected in a bypass circuit around a precharge breaker, such as breaker 12 shown in FIG. 2.

Figure 4:
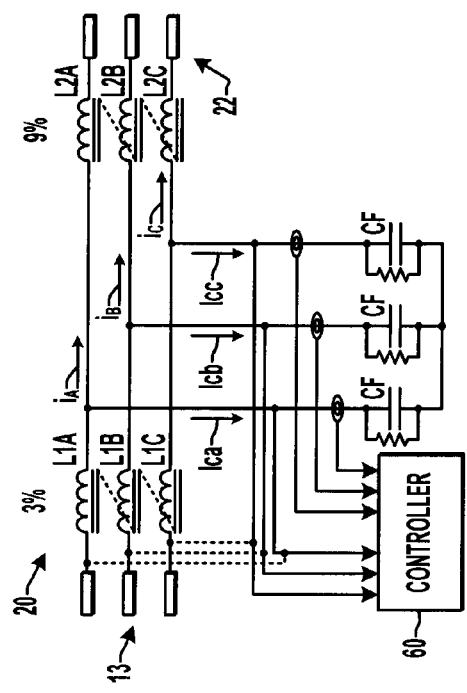
FIG. 4 is a schematic diagram illustrating another LCL filter circuit having Y-connected filter capacitors connected between individual converter phases and a common node.

Referring also to FIGS. 3, 3A, 4 and 4A, the precharge circuit outputs 13 are connected to an LCL or LC input filter circuit 20. In certain embodiments, the precharge circuitry 10 may be omitted, and the LCL or LC filter circuit 20 is directly or indirectly coupled with the power converter AC inputs 3. The filter circuit 20 in FIGS. 3 and 4 includes an LCL circuit for each input phase, including a first (e.g., 3%) inductor L1 (e.g., L1A, L1B and L1C) and a second (e.g., 9%) inductor L2 (L2A, L2B and L2C) coupled in series with one another between the corresponding precharge circuit output 13 (or the corresponding AC input terminal 3) and a corresponding phase output 22 of the filter circuit 20. A plurality of filter capacitors CF are provided, with at least one of the filter capacitors CF connected to each of the phase lines at a center node between the corresponding first and second inductors L1 and L2. In the example of FIG. 3, the filter capacitors CF are connected in a delta configuration with a first capacitor CF connected between phases A and B, a second capacitor CF connected between phases B and C, and a third filter capacitor CF connected between phases C and A. Discharge resistors may be provided in certain embodiments as shown in FIG. 3, with each such resistor being connected between a corresponding one of the power phases and an internal node such as a neutral. FIG. 4 illustrates another embodiment in which the filter capacitors CF and corresponding parallel-connected discharge resistors are connected in a "Y" configuration, with each filter capacitor CF being connected between a corresponding one of the power phases and a common node, which in turn may be connected to a system ground, a neutral of the input power source 4, or which may be only connected to the filter capacitors CF in various embodiments.

As seen in FIGS. 3A and 4A, current source converter embodiments can include an LC filter with a plurality of filter capacitors CF connected downstream of corresponding inductors L1A, L1B and L1C connected in the corresponding power phases between the filter capacitor connection points and the AC input 3. In these embodiments, moreover, discharge resistors may be connected in parallel with each of the filter capacitors CF as shown, or such discharge resistors may be omitted in other embodiments. FIG. 3A illustrates a current source converter embodiment of the filter circuit 20 in which the filter capacitors CF are connected in a delta configuration with discharge resistors connected between the corresponding filter capacitor connections and a central node. FIG. 4A illustrates another embodiment of an LC filter circuit 20 for a current source converter system 2 in which the filter capacitor CF are connected in a Y-configuration along with parallel-connected discharge resistors.

FIG. 5 illustrates an active front end (AFE) rectifier circuit 30 in the power conversion system of FIG. 1, as well as a DC link circuit 40. In the illustrated example, the rectifier 30 includes switching devices Q1-Q6, such as insulated gate bipolar transistors (IGBTs) or other electrical switching devices. Q1-Q6 are individually operable according to a corresponding rectifier switching control signal from the controller 60 to selectively couple a corresponding one of the phase lines A, B and C to one of two DC circuit nodes 32 or 34 to rectify input AC power to provide DC power to the DC link 40, where the controller 60 may provide the switching control signals according to any suitable switching scheme such as pulse width modulation (PWM). The rectifier 30 may alternatively or in combination provide passive rectifier diodes D1-D6 individually coupled between one of the AC nodes 22 at the filter circuit output and a corresponding one of the DC nodes 32, 34 for passive rectification of AC input power to establish the DC link 40. Certain embodiments of the rectifier 30 may provide regenerative operation (with or without the passive rectifier diodes D1-D6 rectifying input power to charge the capacitors C1, C2 of the DC link circuit 40), in which the controller 60 selectively actuates the rectifier switches Q1-Q6 via pulse width modulation or other suitable switching technique for selective connection of the DC nodes 32, 34 with the input nodes 22 to allow conduction of regenerative current from the DC link 40 back towards the power source 4.

The DC link circuit 40 (also shown in FIG. 5) includes one or more capacitances coupled between the DC circuit nodes 32 and 34 for voltage source converter implementations, where FIG. 5 illustrates one embodiment in which two capacitances C1 and C2 are connected in series with one another between the nodes 32 and 34. The DC link capacitance may be constructed using any suitable number of capacitor devices connected in any suitable series, parallel or series/parallel configurations to provide a capacitance connected between the DC nodes 32 and 34. Current source converter embodiments are possible in which the DC link circuit 40 includes one or more inductances (not shown) and the filter 20 can be an LC circuit as shown in FIGS. 3A and 4A above.

Figure 6:
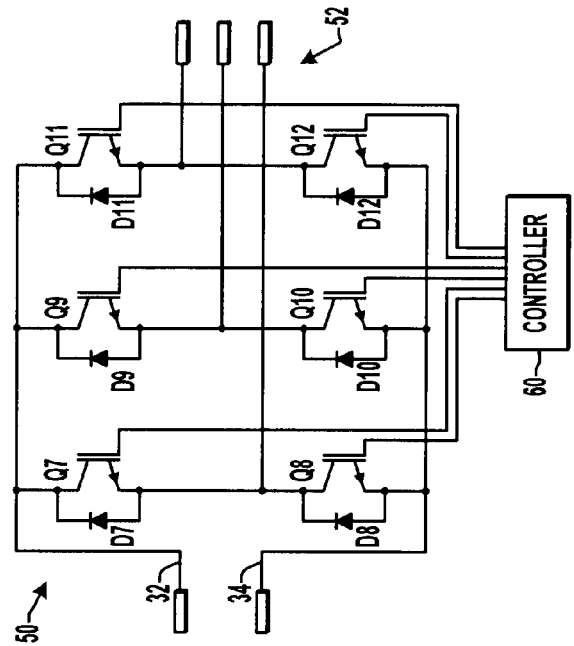
FIG. 6 is a schematic diagram illustrating a three-phase inverter in the power conversion system of FIG. 1.

FIG. 6 illustrates an inverter circuit 50 including inverter switching devices Q7-Q12 and corresponding parallel-connected rectifier diodes D7-D12, where the controller 60 provides inverter switching control signals to the devices Q7-Q12 in order to selectively couple a corresponding DC terminal 32, 34 with a corresponding one of the AC outputs 52 so as to convert DC link power to provide AC output power to drive the load 6 in a controlled manner. The controller 60 can provide the inverter switching control signals according to any suitable pulse width modulation or other switching technique in order to provide AC output power to drive the load 6, which can be accomplished according to any suitable control technique, for instance, to regulate output frequency, output power, motor speed control, motor torque control, etc. or combinations thereof.

Figure 7:
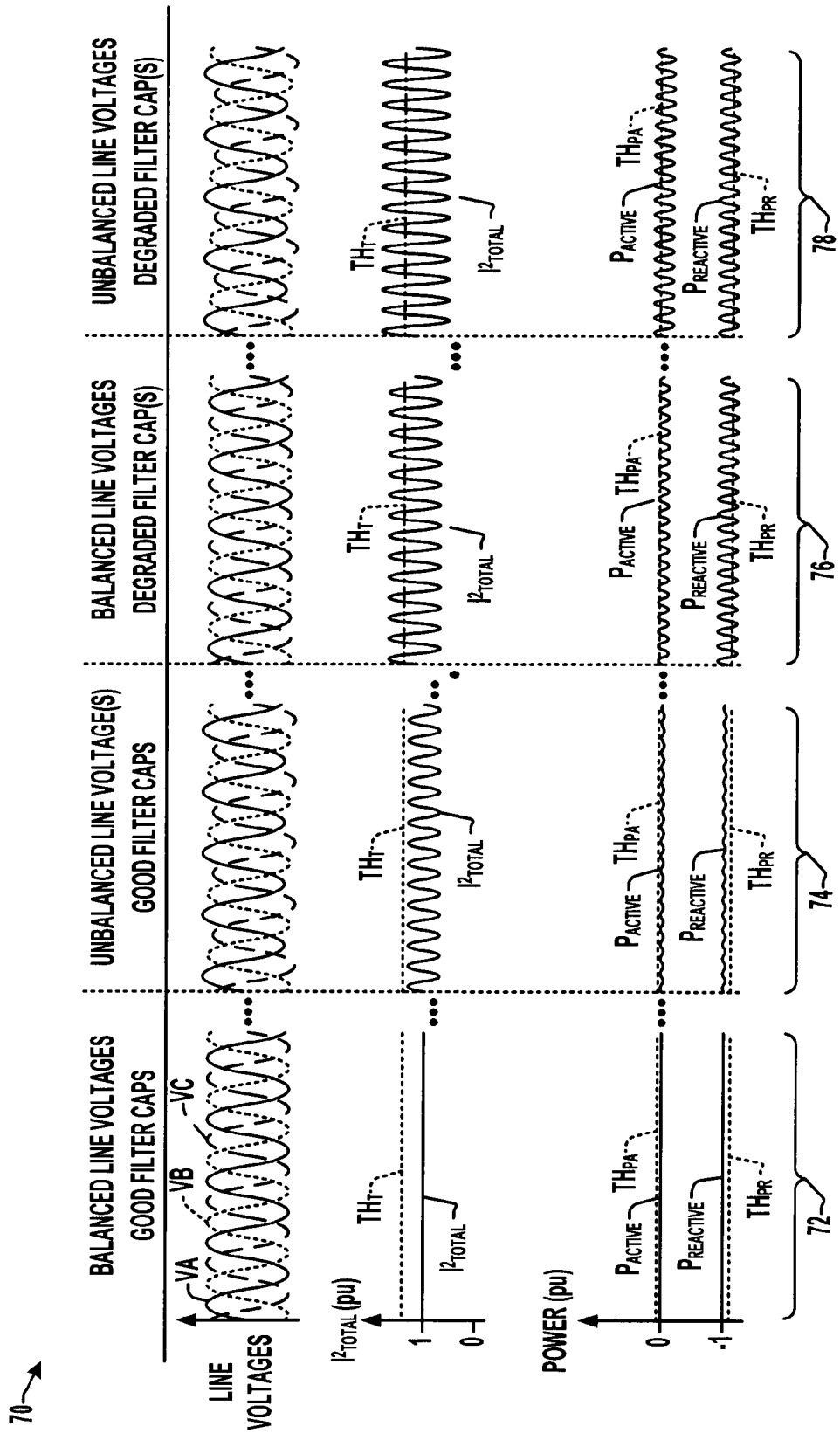
FIG. 7 is a graph showing three-phase AC voltages along with computed sum of squares filter capacitor current values and real and reactive power values for balanced and unbalanced line voltage conditions for good filter capacitors and degraded filter capacitors.

Referring now to FIGS. 3, 4 and 7, certain embodiments of the controller 60 include at least one processor (e.g., a microprocessor, microcontroller, field programmable gate array, programmable logic, etc.) programmed or otherwise configured to identify suspected degradation of one or more of the filter capacitors CF of the filter circuit 20 based at least in part on the filter capacitor currents Ic flowing in the filter capacitors CF (Ica, Icb and Icc in the three-phase example of FIGS. 3 and 4). In certain embodiments, the controller 60 implements the filter capacitor degradation detection functionality using one or more processors of a general power conversion system controller. In other embodiments, one or more of these filter capacitor degradation identification functions is performed by a FPGA or other processor local to the LCL filter circuit 20. In other embodiments, hardware circuitry can be used alone or in combination with one or more processor components to implement the filter capacitor degradation concepts disclosed herein.

As noted above, the filter capacitors CF can be connected in a delta configuration (e.g., FIG. 3, alone or with optional discharge resistors as shown) or may be connected in a Y-configuration (e.g., FIG. 4). The controller 60 is provided with signals or values indicating the levels of the filter capacitor currents Ica, Icb and Icc by any suitable means, such as by current sensors in the lines connecting the filter capacitors CF to the phase lines A, B and C as shown in FIGS. 3 and 4. In this regard, the capacitor currents in the delta-connected filter capacitor configuration of FIG. 3 can be sensed or measured using sensors configured in the lines connecting the delta configuration to the phase lines A, B and C as shown, or sensors can be connected in series with each of the individual delta-connected capacitors CF in other embodiments. It is noted that these filter capacitor currents Ica, Icb and Icc will be typically less than the phase currents $i_A$, $i_B$ and $i_C$ flowing between the filter circuit inputs and outputs 22. In the example of FIG. 4, current sensors are provided in series with each of the filter capacitor CF in order to measure the corresponding filter capacitor current by virtue of the Y-connection. Moreover, in certain embodiments, the controller 60 may also be provided with signals or values indicating the AC voltages in the filter circuit, such as line-line voltages (e.g., $V_{AB}$, $V_{BC}$ and $V_{CA}$) and/or line-neutral voltages ($V_A$, $V_B$ and $V_C$) by suitable sensors or other means. In certain embodiments, the converter 2 includes voltage sensors to measure the converter voltages across the filter capacitors CF as seen in FIGS. 3 and 4, and other embodiments are possible in which the voltages are measured at the input side of the 3% inductors L1 as shown in dashed lines in FIGS. 3 and 4.

As best seen in FIG. 3, in certain embodiments, the controller 60 identifies suspected filter capacitor degradation using an instantaneous sum of the squares of the filter capacitor current values Ica, Icb and Icc and one or more threshold values 65. As mentioned, the controller 60 may be implemented using at least one processor, where one, some or all of the illustrated components 61-65, 67 and 68a-68c can be implemented in hardware and/or as processor-executed components. In the illustrated implementation, the sensed filter capacitor current values Ica, Icb and Icc are low pass filtered using a filter 61. In certain embodiments, the low pass filter 61 has a cutoff frequency $F_{CUTOFF}$ set to approximately 200 Hz, which is between third and fourth harmonics of the fundamental frequency of the AC input source 4 (e.g., for a source frequency of 50 Hz or 60 Hz). In other embodiments using input power of a different fundamental frequency, the low pass filter 61 may be preferably operated with a cutoff frequency set between the second and third harmonics of the source fundamental frequency. The filtered signals in certain embodiments are provided to a scaling component 62 with which the filtered signals or values are scaled according to any necessary scaling based on the calibration of the current sensors, the gain of the low pass filter circuit 61, the scaling associated with computation and adjustment of the threshold value or values 65, etc. In other embodiments, the scaling component 62 may be omitted.

The low pass filtered signals or values are then used to compute a sum of the squares of the low pass filtered filter capacitor currents Ica, Icb and Icc via an instantaneous measurement computation component 63 in FIG. 3. For example, the computation component 63 can compute an instantaneous measurement value $I^2_{TOTAL}$=Ica$^2$+Icb$^2$+Icc$^2$ and a comparison component 64 can selectively provide an alarm and/or initiate one or more remedial actions 66 if the instantaneous measurement value $I^2_{TOTAL}$ (e.g., the sum of the squares of the filter capacitor currents) exceeds a threshold 65 or falls outside a range defined by upper and lower thresholds 65.

In hardware implementations, the threshold(s) 65 can be provided as one or more signals, and/or in programmable processor implementations, the threshold(s) 65 can be one or more values. In certain embodiments, the threshold 65 can be a predetermined value, and the controller 60 in certain embodiments selectively adjusts the threshold 65 based at least partially on voltage balance conditions in the power converter 2. In such implementations, the controller 60 includes or otherwise implements a voltage unbalance component 67 that measures or otherwise receives signals or values indicating the line-line and/or line-neutral voltages associated with the phases A, B and C and determines a voltage balance condition (e.g., quantified by any suitable numeric techniques to indicate a degree of unbalance in the AC voltages associated with the phases A, B and C). In other embodiments as described below in connection with FIGS. 10 and 11, upper and lower threshold values 65 are provided, and one or both of these can be selectively adjusted by the controller 60 based on voltage unbalance conditions and/or on input voltage levels. For instance, upper and lower thresholds 65 can be used for detecting unbalanced capacitor and open capacitor conditions. Moreover, both thresholds 65 can be adjusted upward by the controller 60 if the AC input voltage received from the power source 4 is high and these can be adjusted downward if the AC input voltage is low relative to a nominal voltage value. The controller 60 may also be provisioned with a frame size 68a rating associated with the power conversion system 2, a voltage class indicator or value 68b associated with the power converter 2 and/or capacitor tolerance data, value(s) or information 68c indicating one or more tolerance values (e.g., maximum rated current values, etc.) associated with the filter capacitors CF. Based on the most recent voltage unbalance condition determination 67, the controller 60 in certain embodiments selectively adjusts the threshold 65 based on the degree of unbalance in the converter AC voltages. In certain embodiments, the controller 60 selectively increases the threshold 65 if the AC voltages are unbalanced to facilitate detection of filter capacitor degradation as distinct from voltage unbalance conditions.

FIG. 7 illustrates a graph 70 showing three-phase AC voltages for the phases A, B and C along with computed sum of squares filter capacitor current values $I^2_{TOTAL}$ and corresponding threshold $TH_T$ for balanced and unbalanced line voltage conditions, respectively, for good filter capacitors CF and degraded filter capacitors CF. The inventors have appreciated that the instantaneous measurement value $I^2_{TOTAL}$ will generally have a fairly constant nonzero value during normal operation with balanced line voltages and good filter capacitors CF (section 72 in the graph 70 of FIG. 7). The threshold $TH_T$ in certain embodiments is determined according to the converter frame size 68a, the voltage class 68b and/or capacitor tolerance information 68c, and may be predetermined and stored in the controller 60 or elsewhere in electronic memory of the power conversion system 2.

In certain embodiments, moreover, the individual filter capacitors CF are constructed using an interconnection of multiple component capacitors in series and/or parallel combinations. In such embodiments, the threshold $TH_T$ is set at least partially according to the value(s) of the component capacitors forming the filter capacitance CF as well as according to the interconnection configuration of the component capacitors. For instance, if each filter capacitor CF is formed by a series connection of three component capacitors of equal capacitance value, the capacitance unbalance caused by failure of one of the component capacitors is about 25%, and the threshold $TH_T$ may be set according to the corresponding ripple resulting from such a capacitance imbalance. In contrast, embodiments in which the filter capacitor CF is formed by a series connection of two component capacitors, the resulting capacitance change is 50%, and the corresponding resulting ripple current effect is larger, whereby the threshold $TH_T$ may be set higher for such alternate implementations. Any series and/or parallel interconnection configuration of the component capacitors forming the individual filter capacitors CF can be accommodated by corresponding threshold values $TH_T$.

During operation, voltage unbalance conditions are verified periodically by certain embodiments of the controller 60 via the component 67, and the threshold 65 may be selectively adjusted based on the amount of unbalance in the AC voltages to provide an adjusted threshold for unbalanced line voltage conditions. In certain embodiments, the threshold will then be reduced upon return to balanced AC voltages. In addition, the inventors have appreciated that the computed filter capacitor current sum of the squares value $I^2_{TOTAL}$ will generally have an AC component generally at a frequency between the second and third harmonics of the power source 4 during unbalanced line voltage conditions as shown at 74 in FIG. 7. Accordingly, in certain embodiments, the controller 60 low pass filters the sensed filter capacitor current signals or values (e.g., low pass filter 61 in FIG. 3) using a cutoff frequency $F_{CUTOFF}$ of about 200 Hz in one example for use with 50 Hz or 60 Hz power sources 4 before computing the value $I^2_{TOTAL}$. In certain embodiments, the controller 60 advantageously provides the threshold 65 at a level slightly above the normal operating level of the sum of the squares total $I^2_{TOTAL}$ of the sensed filter capacitor currents, and selectively increases the threshold 65 to the level above the maximum AC level of the instantaneous measurement value $I^2_{TOTAL}$ at 74 to differentiate between voltage unbalance effects and filter capacitor degradation.

As seen at 76 and 78 in FIG. 7, the amplitude of the AC component of the sum of the squares total $I^2_{TOTAL}$ increases significantly upon the onset of filter capacitor degradation. Thus, using the threshold $TH_T$ (at 76 in FIG. 7), the controller 60 uses the comparison component 64 to determine that the instantaneous measurement value $I^2_{TOTAL}$ exceeds the threshold 65 and may accordingly initiate an alarm and/or other remedial action via component 66. The controller 60 in certain embodiments, moreover, may selectively modify the threshold based on voltage unbalance conditions, and can thus detect filter capacitor degradation (e.g., at 78) while avoiding false alarms based on voltage unbalance conditions (e.g., at 74 in FIG. 7).

The inventors have further appreciated that the instantaneous measurement value $I^2_{TOTAL}$ advantageously provides a suitable means for detecting filter capacitor degradation, wherein the nominal average value (e.g., 1 pu) for healthy filter capacitors is accompanied by only minimal peak ripple (e.g., about 0.02-0.2 pu in certain implementations) for voltage unbalance conditions. In contrast, the instantaneous sum of squares value $I^2_{TOTAL}$ increases relatively significantly (e.g. to about 1.16-1.3 with a corresponding increase ripple of about 0.3-0.5 in certain implementations) when one or more filter capacitors degrade (e.g., for balanced line voltage conditions at 76 in FIG. 7) and therefore provides a significant change relative to the ripple associated with voltage unbalance conditions. Thus, this technique provides a fairly robust mechanism for distinguishing between voltage unbalance conditions and filter capacitor degradation affects in the power conversion system 2.

Figure 8:
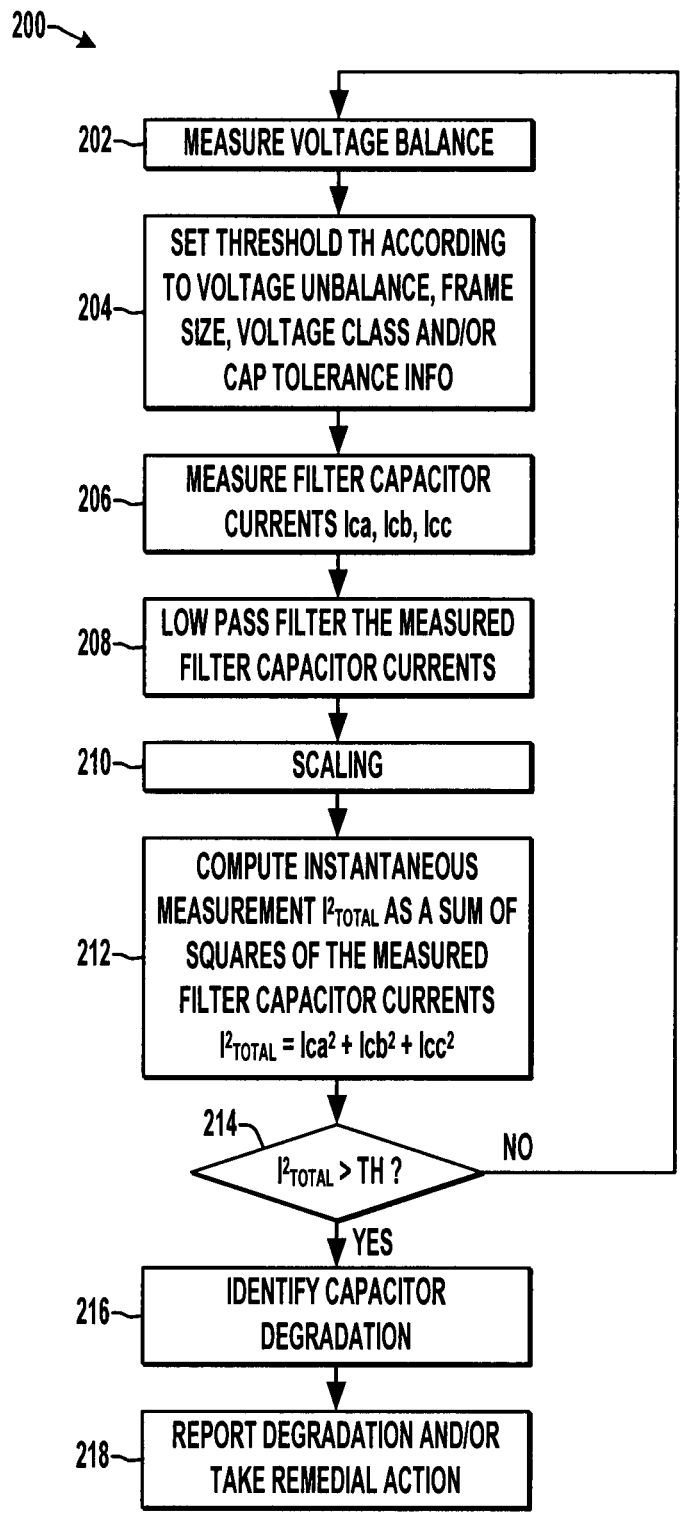
FIG. 8 is a flow diagram illustrating a method of identifying suspected filter capacitor degradation in a power conversion system using a sum of the squares of the filter capacitor current values.

FIG. 8 illustrates a method 200 of identifying suspected filter capacitor degradation in a power conversion system (e.g., system 2 above) by threshold comparison of a sum of squares computation of filter capacitor current values. Although the exemplary method 200 of FIG. 8 and the method 300 of FIG. 9 below are hereinafter illustrated and described in the form of a series of acts or events, the various methods of the present disclosure are not limited by the illustrated ordering of such acts or events except as specifically set forth herein. In this regard, except as specifically provided in the claims, some acts or events may occur in different order and/or concurrently with other acts or events apart from those acts or events and ordering illustrated and described herein, and not all illustrated steps may be required to implement a process or method in accordance with the present disclosure. The disclosed methods, moreover, may be implemented in hardware, processor-executed software, programmable logic, etc., or combinations thereof, in order to provide the described functionality, wherein these methods can be practiced in the above described power conversion system 2, such as in the controller 60, although the presently disclosed methods are not limited to the specific applications and implementations illustrated and described herein. Moreover, the methods 200 and 300 may be embodied as a computer executable instructions stored on a non-transitory computer readable medium, such as a memory operatively associated with the controller 60 and/or with the power conversion system 2.

A voltage balance condition is assessed at 202 in FIG. 8, such as by the controller 60 measuring one or more voltages (e.g., line-line and/or line-neutral voltages) associated with the converter 2. For instance, as seen in FIGS. 3 and 4 above, the controller 60 may receive signals and/or values indicating the voltages at the center nodes of the LCL filter circuit 20. At 204, the controller 60 sets or otherwise adjusts the threshold TH (e.g., $TH_B$, $TH_{UB}$) based at least partially on voltage unbalance, frame size, voltage class, and/or any capacitor tolerance information (e.g., 67 and/or 68a-68c in FIG. 3 above). The filter capacitor currents (e.g., Ica, Icb and Icc) are measured or otherwise obtained at 206 in FIG. 8, and are filtered at 208 using a low pass filter (e.g., filter component 61 in FIG. 3 above, with a cutoff frequency $F_{CUTOFF}$ set between the second and third harmonic). At 210, the filtered signals or values may be scaled in certain embodiments, and an instantaneous measurement value is computed at 212 (e.g., $I^2_{TOTAL}$) as a sum of the squares of the measured (and filtered and optionally scaled) filter capacitor currents Ica, Icb and Icc.

A determination is made at 214 as to whether the sum of squares value $I^2_{TOTAL}$ exceeds a threshold (e.g., threshold $TH_B$, $TH_{UB}$, as set or adjusted at 204). If not (NO at 214), the process 200 repeats, returning to 202-212 as described above. If the threshold value is exceeded (YES at 214), the controller 60 identifies or otherwise determines at 216 that one or more of the filter capacitors 64 is degraded/degrading, and may optionally report the suspected degradation and/or take one or more remedial actions at 218. For instance, the controller may open the main circuit breaker 12 and the precharge contactor 16 in the precharge circuitry 10 of FIG. 2 above and/or may initiate other controlled shutdown and reporting operations, such as setting an alarm, indicating a capacitor degradation condition on a user interface of the power conversion system 2, sending an error message to a supervisory controller associated with the power converter 2, etc. In addition, or separately, the controller 60 may log a fault and reset the power converter 2, such as by storing a value to a fault log in a nonvolatile memory of the power converter 2 (not shown), or the controller 60 may indicate a non-resettable fault to a human machine interface (HMI, not shown) for different levels of suspected degradation (e.g., as indicated by the relative comparison with the threshold 65), and/or may only allow a fault to be reset upon password-protected input by service personnel after filter capacitor inspection.

Figure 9:
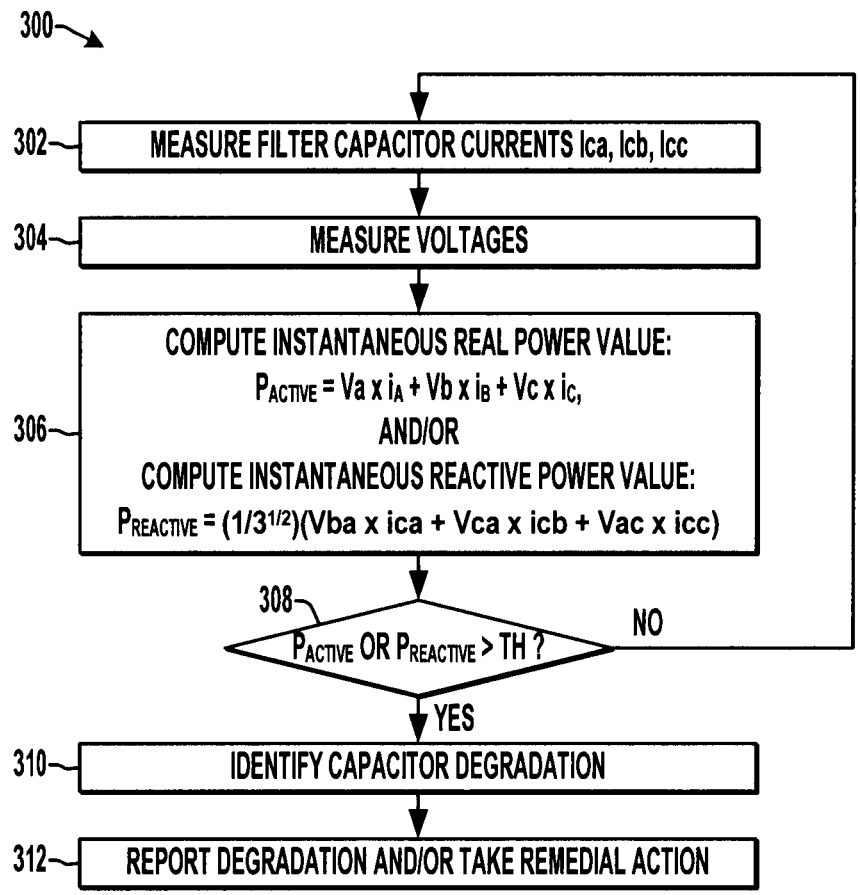
FIG. 9 is a flow diagram illustrating another method of identifying suspected filter capacitor degradation in a power conversion system using computed real and/or reactive power computations.

Referring now to FIGS. 3, 7 and 9, the controller 60 in certain embodiments may measure a plurality of filter capacitor currents and AC voltages associated with a power converter 2, and assess filter capacitor degradation based on a computed power value. FIG. 9 illustrates an exemplary process 300 for identifying suspected power converter filter capacitor degradation using computed real and/or reactive power computations, which may be implemented using the controller 60 in certain embodiments. At 302 in FIG. 9, the controller 60 measures filter capacitor currents (e.g., Ica, Icb and Icc) and measures voltages at 304 associated with the power converter 2. At 306, the controller 60 computes a real or active power value ($P_{ACTIVE}$) and/or a reactive power value ($P_{REACTIVE}$) based at least partially on the filter capacitor currents and the voltages obtained at 302 and 304. For instance, the controller 60 in certain embodiments may compute an active power value as $P_{ACTIVE}=Va \times i_A+Vb \times i_B+Vc \times i_C$ and/or compute reactive power value $P_{REACTIVE}$ ($1/3^{1/2}$)(Vba×Ica+Vca×Icb+Vac×Icc). At 308, the controller 60 compares the computed power value(s) ($P_{ACTIVE}$ and/or $P_{REACTIVE}$) with a threshold (e.g., active and reactive power thresholds $TH_{PA}$ and $TH_{PR}$, respectively, in FIG. 7). If the threshold is not exceeded (NO at 308), the process 300 returns to 302-306 as described above. However, if the threshold is exceeded (YES at 308), the controller 306 identifies the suspected filter capacitor degradation at 310 and can report the degradation and/or take one or more remedial actions at 312, for instance as described above in association with 218 of FIG. 8.

As seen in FIG. 7, the inventors have appreciated that the active power ($P_{ACTIVE}$ in FIG. 7) may have a small AC component for unbalanced line voltages, such as the situation (e.g., at 74) where the filter capacitors CF are not degraded. Thus, the active threshold $TH_{PA}$ is set in certain embodiments to be above this expected AC value (where the nominal active power is typically at 0). Moreover, the inventors have appreciated that filter capacitor degradation will result in a larger AC ripple component of both the active and reactive power values $P_{ACTIVE}$ and $P_{REACTIVE}$, and the controller 60 accordingly uses one or more of the threshold values $TH_{PA}$ and $TH_{PR}$ so as to be able to detect degraded filter capacitor conditions (e.g., at 76 and 78 in FIG. 7) as distinct from unbalanced line voltage conditions (e.g., at 74 in FIG. 7).

Figure 10:
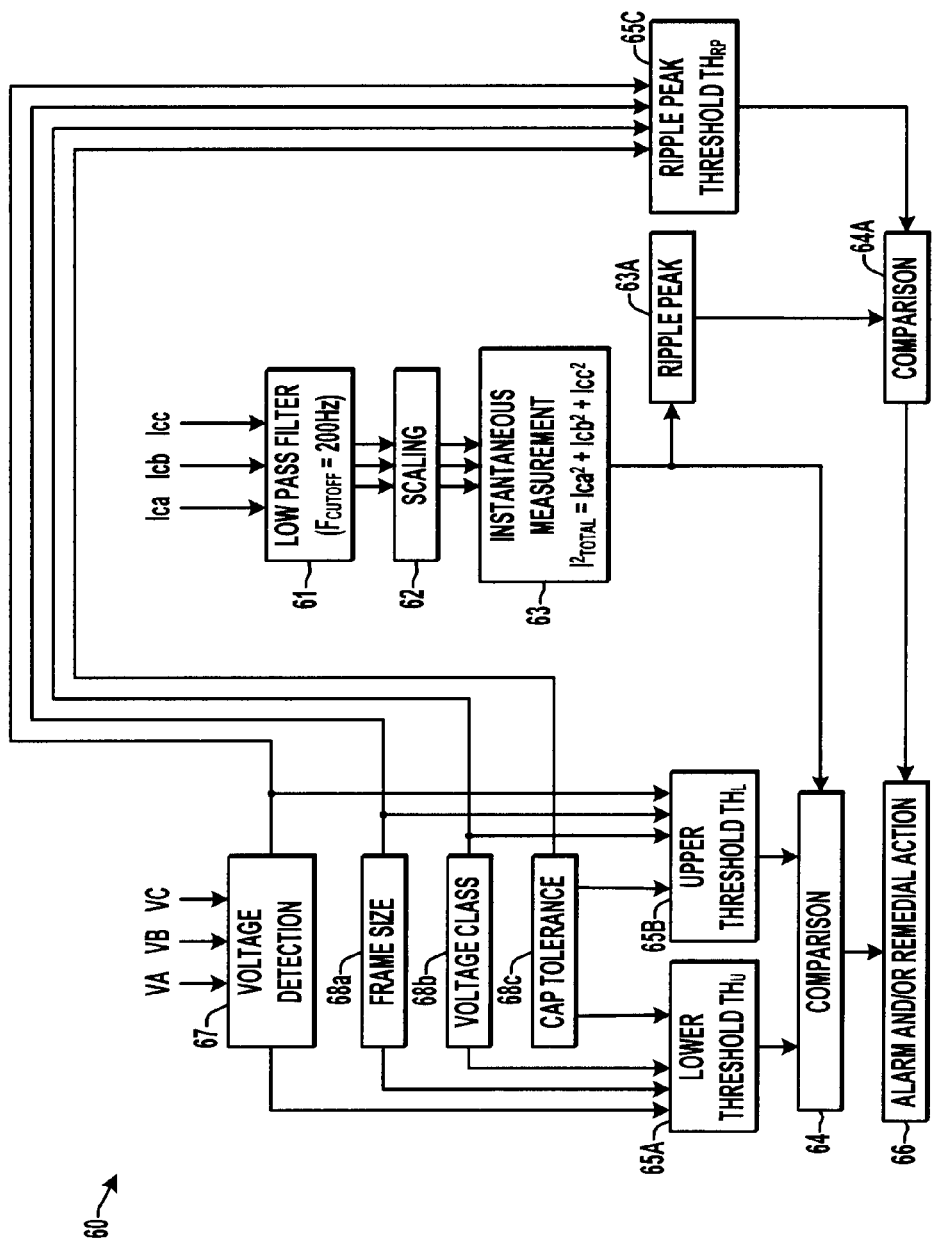
FIG. 10 is a schematic diagram illustrating another controller embodiment performing a dual threshold comparison of an instantaneous sum of squares filter capacitor current value and a single threshold comparison of a peak ripple value for selective identification of suspected filter capacitor degradation.
Figure 11:
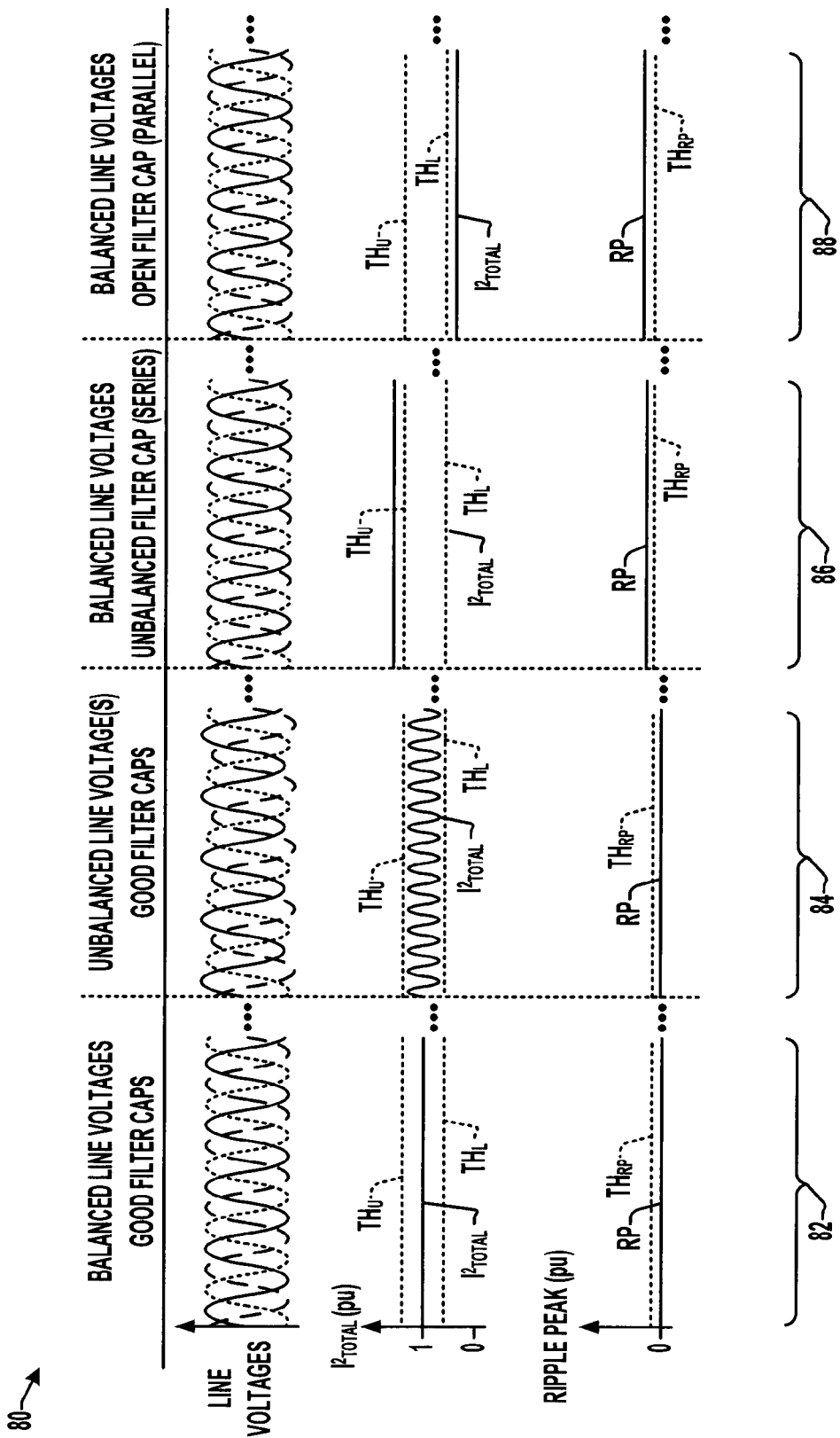
FIG. 11 is a graph showing three-phase AC voltages along with computed sum of squares filter capacitor current values with corresponding upper and lower thresholds as well as a peak ripple value and a corresponding threshold for identifying suspected filter capacitor degradation in the controller of FIG. 10.

Referring now to FIGS. 10 and 11, in certain embodiments, multiple threshold values 65 can be employed by the controller 60 for detecting open and/or unbalanced filter capacitor conditions. These multiple threshold comparison techniques can be employed in association with instantaneous active and/or reactive power values (e.g., $P_{ACTIVE}$ and $P_{REACTIVE}$) and/or with at least one sum of squares value (e.g., $I^2_{TOTAL}$) or combinations thereof.

FIG. 10 illustrates an implementation in the controller 60 using the instantaneous sum of squares value $I^2_{TOTAL}$ from the component 63 based on the filter capacitor currents (Ica, Icb, Icc) via the low pass filter 61 and the optional scaling component 62 as discussed above. The sum of squares value $I^2_{TOTAL}$ is provided to a comparison component 64 and is compared with an upper threshold $TH_U$ 65A and with a lower threshold $TH_L$ 65B. The controller 60 initiates an alarm and/or remedial action 66 if $I^2_{TOTAL}$ is greater than the upper threshold $TH_U$ 65A or lower than the lower threshold $TH_L$ 65B. The inventors have appreciated that certain filter capacitor configurations, such as three component capacitors connected in parallel to form one of the filter capacitances CF may be subject to open capacitor degradation effects, in which the instantaneous sum of squares value $I^2_{TOTAL}$ may decrease. Accordingly, comparison of this value $I^2_{TOTAL}$ with the lower threshold $TH_L$ 65B facilitates detection of such open capacitor type degradation. In this regard, the lower threshold $TH_L$ 65B in certain embodiments is determined according to the frame size 68a, the voltage class rating 68b and/or any capacitor tolerance information 68c.

The inventors have further appreciated that certain filter capacitor architectures be subject to unbalanced capacitor degradation, for instance, where three capacitor components are connected in series to form one or more of the filter capacitances CF. In this situation, unbalanced capacitor degradation may increase the instantaneous sum of squares value $I^2_{TOTAL}$. Accordingly, use of the upper threshold $TH_U$ 65A and facilitates detection of such degradation conditions. Also, both upper and lower thresholds 65 may be used in certain embodiments, for example, where the filter capacitances CF include series and/or parallel-connected capacitor components or in other situations in which different forms of filter capacitor degradation may lead to increases and/or decreases in the instantaneous sum of squares value $I^2_{TOTAL}$. As noted above, moreover, such dual-threshold techniques may also be employed in association with real and/or reactive power signals or values (e.g., $P_{ACTIVE}$ and $P_{REACTIVE}$) computed or otherwise derived based at least in part on one or more filter capacitor currents in certain embodiments of the controller 60.

FIG. 11 provides a graph 80 showing examples of upper and lower thresholds $TH_U$ 65A and $TH_L$ 65B used in the controller 60 of FIG. 10 along with the instantaneous sum of squares value $I^2_{TOTAL}$ for balanced line voltages at 82 and unbalanced line voltages at 84, as well as for unbalanced filter capacitors connected in series at 86 (e.g., for balanced line voltage conditions) and open filter capacitor degradation for parallel connection at 88 (also for balanced line voltage conditions). As seen in these examples, the upper threshold $TH_U$ 65A is set to a level (e.g., 1.16 pu in one embodiment) sufficient to avoid false triggering based on purely unbalanced line voltage conditions at 84, while triggering initiation of an alarm and/or remedial action based on unbalanced filter capacitor degradation conditions shown that 86. Also, the lower threshold $TH_L$ 65B is less than 1 pu (e.g., 0.82 pu in one example) which will not cause an alarm for unbalanced line voltage conditions at 84, but will initiate alarm or remedial action for an opened filter capacitor degradation situation as shown at 88 in FIG. 11.

In certain embodiments, moreover, one or both of the upper threshold $TH_U$ 65A and lower threshold $TH_L$ 65B can be adjusted upward by the controller 60 if the AC input voltage received from the power source 4 is high and these can be adjusted downward if the AC input voltage is low relative to a nominal voltage value. As seen in FIG. 10, a voltage detection component 67 can be provided in the controller 60 to monitor one or more of the power converter voltages (e.g., VA, VB and/or VC). The detection component 67 in certain embodiments selectively adjusts one or both of the thresholds $TH_U$ 65A and/or $TH_L$ based at least in part on one or more of the AC voltages associated with the power conversion system 2. For instance, the voltage detection component 67 in certain embodiments increases one or both of the thresholds $TH_U$ 65A and/or $TH_L$ 65B if at least one AC voltage is greater than a nominal value (e.g., greater than 240 V AC in certain embodiments) and decreases one or both of the thresholds 65A and/or 65B if a system voltage is less than the nominal value. In this regard, the inventors have appreciated that high or low voltages provided by the power source 4 may cause respective increases or decreases in the per unit instantaneous sum of squares value $I^2_{TOTAL}$, and the same is true for power signals or values $P_{ACTIVE}$ and/or $P_{REACTIVE}$. Accordingly, the controller 60 in certain embodiments may selectively adjust one or both of the thresholds 65A and/or 65B accordingly.

In the example of FIG. 10, moreover, $I^2_{TOTAL}$ is also provided to a peak ripple component 63A, and the peak ripple component of the instantaneous sum of squares value is compared with a ripple peak threshold $TH_{RP}$ 65C using a comparison component 64A. If the peak ripple component is above the threshold $TH_{RP}$ 65C, the comparison component 64A in certain embodiments initiates an alarm and/or remedial action 66. For instance, as seen in FIG. 11, the threshold $TH_{RP}$ 65C is set to a positive value (e.g., about 0.3 pu in one example) to avoid false tripping for unbalanced line voltage conditions at 84, while initiating an alarm and/or remedial action 66 for unbalanced or opened filter capacitor degradation conditions at 86 and/or 88. As seen in FIG. 10, moreover, the ripple peak threshold $TH_{RP}$ 65C in certain embodiments is set according to one or more of the power converter frame size 68a, voltage class 68b and/or the capacitor tolerance information 68c. Furthermore, the voltage detection component 67 in certain embodiments may selectively increase or decrease the ripple peak threshold $TH_{RP}$ 65C based at least partially on one or more voltages associated with the power conversion system 2, for example by increasing the threshold $TH_{RP}$ 65C if the power converter voltage is above a nominal value, and decreasing the threshold $TH_{RP}$ 65C if the converter voltage is below the nominal value. The controller 60 in certain embodiments can provide for selective alarm and/or remedial action initiation 66 based on one, some, or all of the above threshold comparisons, such as triggering based on the instantaneous sum of squares value $I^2_{TOTAL}$ falling outside of a range defined by the lower and upper thresholds 65A and 65B or triggering on the ripple peak value 63A exceeding the ripple peak threshold $TH_{RP}$ 65C in one possible embodiment. Any other Boolean logic may be used to selectively initiate the alarm and/or remedial action based on one or more of the above described threshold comparisons.

The above examples are merely illustrative of several possible embodiments of various aspects of the present disclosure, wherein equivalent alterations and/or modifications will occur to others skilled in the art upon reading and understanding this specification and the annexed drawings. In particular regard to the various functions performed by the above described components (assemblies, devices, systems, circuits, and the like), the terms (including a reference to a "means") used to describe such components are intended to correspond, unless otherwise indicated, to any component, such as hardware, processor-executed software, or combinations thereof, which performs the specified function of the described component (i.e., that is functionally equivalent), even though not structurally equivalent to the disclosed structure which performs the function in the illustrated implementations of the disclosure. In addition, although a particular feature of the disclosure may have been disclosed with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

The following is claimed:

1. A power conversion system, comprising:
    an AC input coupleable to receive AC input power from a power source;
    a rectifier operative to convert the AC input power to provide a DC output;
    an inverter operatively coupled with the DC output of the rectifier to provide an AC output; and
    a filter circuit coupled between the AC input and the rectifier, the filter circuit comprising a plurality of filter capacitors;
    a controller operative to identify suspected degradation of at least one of the filter capacitors based at least partially on currents flowing in the plurality of filter capacitors;
    wherein the controller is operative to:
        compute a computed value as at least one of a sum of the squares value, an instantaneous active power value, and an instantaneous reactive power value according to a plurality of filter capacitor currents associated with the plurality of filter capacitors; and
        selectively identify suspected filter capacitor degradation if the computed value is greater than an upper threshold or less than a lower threshold;
        measure at least one AC voltage associated with the power conversion system;
        selectively adjust at least one of the upper threshold and the lower threshold based at least partially on the at least one AC voltage; and
        increase the upper threshold and the lower threshold if the at least one AC voltage is greater than a nominal value, and to decrease the upper threshold and the lower threshold if the at least one AC voltage is less than the nominal value.

2. The power conversion system of claim 1:
    wherein the controller is operative to:
        compute the computed value as a sum of the squares of a plurality of filter capacitor currents associated with the plurality of filter capacitors.

3. The power conversion system of claim 2, wherein the controller is operative to:
measure the plurality of filter capacitor currents;
filter the measured filter capacitor currents using a low pass filter with a cutoff frequency set between second and third harmonics of a fundamental power source frequency; and
compute the sum of the squares of the low pass filtered filter capacitor currents.

4. The power conversion system of claim 3, wherein the controller is operative to:
determine an AC voltage balance condition;
selectively adjust the upper and lower thresholds based at least partially on the determined AC voltage balance condition.

5. The power conversion system of claim 2, wherein the controller is operative to:
determine an AC voltage balance condition;
selectively adjust the upper and lower thresholds based at least partially on the determined AC voltage balance condition.

6. The power conversion system of claim 1, wherein the controller is operative to:
measure a plurality of filter capacitor currents associated with the plurality of filter capacitors;
measure a plurality of AC voltages associated with the power conversion system;
compute at least one of an instantaneous active power value and an instantaneous reactive power value according to the measured filter capacitor currents and the measured AC voltages;
compare the computed power value to a threshold; and
selectively identify suspected filter capacitor degradation if the computed power value exceeds the threshold.

7. The power conversion system of claim 1, wherein the filter circuit is an LCL circuit with first and second inductors connected in series with one another between each input terminal of the AC input and a corresponding input phase of the rectifier, with at least one of the plurality of filter capacitors connected to a center node between the first and second inductors.

8. The power conversion system of claim 1, wherein the plurality of filter capacitors are connected in a delta configuration.

9. The power conversion system of claim 1, wherein the plurality of filter capacitors are connected in a Y configuration.

10. A method for identifying suspected filter capacitor degradation in a power conversion system, the method comprising:
measuring a plurality of filter capacitor currents associated with a plurality of filter capacitors of the power conversion system;
selectively identifying suspected filter capacitor degradation based at least partially on the plurality of filter capacitor currents;
computing a computed value as at least one of a sum of the squares value, an instantaneous active power value, and an instantaneous reactive power value according to the plurality of filter capacitor currents;
selectively identifying suspected filter capacitor degradation if the computed value is greater than an upper threshold or less than a lower threshold;
measuring at least one AC voltage associated with the power conversion system;
selectively adjusting at least one of the upper threshold and the lower threshold based at least partially on the at least one AC voltage;
increasing the upper threshold and the lower threshold if the at least one AC voltage is greater than a nominal value; and
decreasing the upper threshold and the lower threshold if the at least one AC voltage is less than the nominal value.

11. The method of claim 10, comprising:
computing a sum of the squares of a plurality of filter capacitor currents associated with the plurality of filter capacitors.

12. The method of claim 11, comprising:
measuring the plurality of filter capacitor currents;
filtering the measured filter capacitor currents using a low pass filter with a cutoff frequency set between second and third harmonics of a fundamental power source frequency; and
computing the sum of the squares of the low pass filtered filter capacitor currents.

13. The method of claim 12, comprising:
determining an AC voltage balance condition; and
selectively adjusting the upper and lower thresholds based at least partially on the determined AC voltage balance condition to increase the threshold if the AC voltage is unbalanced.

14. The method of claim 11, comprising:
determining an AC voltage balance condition; and
selectively adjusting the upper and lower thresholds based at least partially on the determined AC voltage balance condition to increase the threshold if the AC voltage is unbalanced.

15. The method of claim 10, comprising:
measuring a plurality of filter capacitor currents associated with a plurality of filter capacitors of the power conversion system;
measuring a plurality of AC voltages associated with the power conversion system;
computing at least one of an instantaneous active power value and an instantaneous reactive power value according to the measured filter capacitor currents and the measured AC voltages; and
comparing the computed power value to the threshold; and
selectively identifying suspected filter capacitor degradation if the computed power value exceeds the threshold.

* * * * *